(12) United States Patent
Ronay et al.

(10) Patent No.: US 12,096,563 B2
(45) Date of Patent: Sep. 17, 2024

(54) FLEXIBLE AND STRETCHABLE STRUCTURES

(71) Applicant: Liquid Wire Inc., Portland, OR (US)

(72) Inventors: Mark William Ronay, Portland, OR (US); Trevor Antonio Rivera, Portland, OR (US); Michael Adventure Hopkins, Portland, OR (US); Katherine M. Nelson, Portland, OR (US); Charles J. Kinzel, Portland, OR (US)

(73) Assignee: Liquid Wire Inc., Portland, OR (US)

( * ) Notice: Subject to any disclaimer, the term of this patent is extended or adjusted under 35 U.S.C. 154(b) by 107 days.

(21) Appl. No.: 17/446,598

(22) Filed: Aug. 31, 2021

(65) Prior Publication Data

US 2022/0071014 A1 Mar. 3, 2022

Related U.S. Application Data

(60) Provisional application No. 63/203,796, filed on Jul. 30, 2021, provisional application No. 63/072,920, filed on Aug. 31, 2020.

(51) Int. Cl.
*H05K 1/18* (2006.01)
*H05K 1/02* (2006.01)
(Continued)

(52) U.S. Cl.
CPC ........... *H05K 1/189* (2013.01); *H05K 1/0283* (2013.01); *H05K 1/147* (2013.01); *H05K 1/092* (2013.01);
(Continued)

(58) Field of Classification Search
CPC ...... H05K 1/189; H05K 1/0283; H05K 1/147; H05K 1/092; H05K 1/115; H05K 1/116;
(Continued)

(56) References Cited

U.S. PATENT DOCUMENTS

| | | |
|---|---|---|
| 10,672,530 B2 | 6/2020 | Ronay |
| 11,088,063 B2 | 8/2021 | Ronay et al. |

(Continued)

FOREIGN PATENT DOCUMENTS

| | | |
|---|---|---|
| WO | 2018123818 | 7/2018 |
| WO | WO-2018123818 A1 | 7/2018 |

(Continued)

OTHER PUBLICATIONS

"International Application Serial No. PCT US2022 074296, Invitation to Pay Additional Fees mailed Nov. 10, 2022", 10 pgs.

(Continued)

*Primary Examiner* — Roshn K Varghese
(74) *Attorney, Agent, or Firm* — Quinn IP Law

(57) ABSTRACT

A flexible hybrid electronic system and method includes a first structure and a second structure. The first structure includes a first flexible substrate, a first electronic component secured to the first flexible substrate, and a first flexible conductive trace formed in part from conductive gel. The second structure includes a second flexible substrate, a second electronic component secured to the second flexible substrate, and a second flexible conductive trace formed in part from conductive gel. The first structure is bonded to the second structure at an interconnect region, the first conductive trace is electrically coupled to the second conductive trace within the interconnect region, and the first electronic component is operatively coupled to the second electronic component.

19 Claims, 4 Drawing Sheets

(51) Int. Cl.
- *H05K 1/14* (2006.01)
- *H05K 1/09* (2006.01)
- *H05K 1/11* (2006.01)

(52) U.S. Cl.
CPC ...... *H05K 1/115* (2013.01); *H05K 2201/0129* (2013.01); *H05K 2201/0195* (2013.01); *H05K 2201/049* (2013.01); *H05K 2201/10098* (2013.01); *H05K 2201/10106* (2013.01); *H05K 2201/10128* (2013.01); *H05K 2201/10151* (2013.01); *H05K 2201/10219* (2013.01)

(58) Field of Classification Search
CPC .......... H05K 1/09; H05K 1/141; H05K 1/142; H05K 1/145; H05K 1/118; H05K 1/185; H05K 1/181; H05K 2201/0195; H05K 2201/049; H05K 2201/10098; H05K 2201/10106; H05K 2201/10128; H05K 2201/10151; H05K 2201/10219; H05K 3/4069

See application file for complete search history.

(56) References Cited

U.S. PATENT DOCUMENTS

| | | | |
|---|---|---|---|
| 2005/0136646 A1* | 6/2005 | Larnerd | H05K 3/429 174/250 |
| 2005/0189645 A1 | 9/2005 | Nakano et al. | |
| 2005/0226995 A1* | 10/2005 | Maharshak | H05K 1/0287 156/278 |
| 2006/0274055 A1* | 12/2006 | Reynolds | H05K 1/144 345/174 |
| 2012/0160547 A1* | 6/2012 | Antesberger | H05K 3/462 174/250 |
| 2012/0176764 A1 | 7/2012 | Loher et al. | |
| 2014/0321075 A1* | 10/2014 | Sung | H01R 43/0249 361/767 |
| 2018/0247727 A1 | 8/2018 | Ronay | |
| 2019/0056277 A1 | 2/2019 | Ronay | |
| 2019/0092955 A1* | 3/2019 | Tabor | H05K 1/097 |
| 2020/0053875 A1 | 2/2020 | Holec et al. | |
| 2020/0066628 A1 | 2/2020 | Ronay et al. | |
| 2020/0305281 A1* | 9/2020 | He | H05K 1/147 |
| 2020/0344880 A1* | 10/2020 | Uno | H05K 3/12 |
| 2020/0381349 A1 | 12/2020 | Ronay et al. | |
| 2020/0386630 A1 | 12/2020 | Ronay et al. | |

FOREIGN PATENT DOCUMENTS

| | | |
|---|---|---|
| WO | 2023010106 | 2/2023 |
| WO | 2023034886 | 3/2023 |

OTHER PUBLICATIONS

"International Application Serial No. PCT US2022 075795, International Search Report mailed Dec. 16, 2022", 4 pgs.

"International Application Serial No. PCT US2022 075795, Written Opinion mailed Dec. 16, 2022", 6 pgs.

"International Application Serial No. PCT US2022 074296, International Search Report mailed Jan. 10, 2023", 6 pgs.

"International Application Serial No. PCT US2022 074296, Written Opinion mailed Jan. 10, 2023", 10 pgs.

"International Application Serial No. PCT/US2022/074296, Invitation to Pay Additional Fees mailed Nov. 10, 22", 10 pgs.

* cited by examiner

FLEXIBLE AND STRETCHABLE STRUCTURES

CROSS-REFERENCE TO RELATED APPLICATION

This patent application claims the benefit of U.S. Provisional Patent Application Nos. 63/072,920, filed Aug. 31, 2020; and 63/203,796, filed Jul. 30, 2021, each of which are incorporated by reference herein in their entirety.

BACKGROUND

Flexible electronic circuits may be utilized in a variety of situations in which an article with such electronics may be expected to be flexed, stretched or bent routinely as part of use of the article, such as in apparel and wearable articles as well as other consumer and industrial applications. To the extent that electronics are manufactured to be flexible and stretchable as would be understood by a typical user, such characteristics are typically constrained by multiple factors. Among such constraints is a difficulty of modular construction. Owing to constraints that limit the design of such flexible circuits, such as the difficulty of interconnection points to be coupled together, e.g., with solder or other breakable and/or non-stretchable materials, the ability to couple multiple flexible electronic structures together while still maintaining the full range of flexibility of the resulting assembly may be highly limited or impossible.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
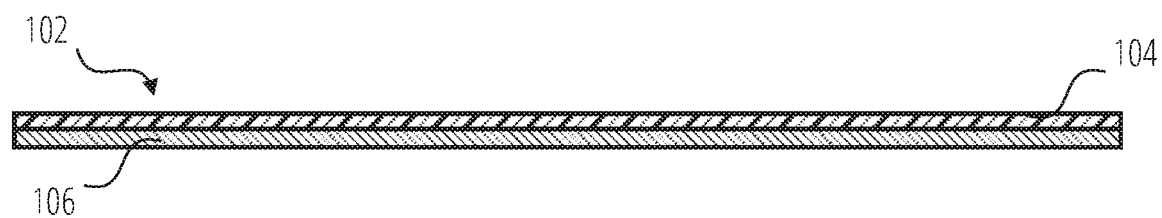
FIG. 1 is an example of a flexible and stretchable structure, in an example embodiment.

Example methods and systems are directed to a modular deformable electronic assembly, system, and method. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

A flexible and stretchable modular assembly has been developed that allows for flexible and stretchable structures to be electrically and mechanically coupled together while maintaining the flexible and stretchable properties of the assembly as a whole. Such a modular system may include bondable modular electronic laminates such as a central computation core or element and one or more bondable peripherals. The central computational core may include one or more controllers or processing units which may be implemented as, and/or packaged with, one or more integrated circuits, capacitors, resistors, inductors, contact terminals, and/or the like. The peripherals may include one or more capacitors, resistors, inductors, contact terminals, diodes (including LEDs) sensors (such as pressure, strain, temperature sensors, etc.), and/or the like.

In some embodiments, an assembly may be formed with transfer laminates or other components that may be flexible and/or stretchable in nature and which may host electronic elements in any form such as packaged and/or unpackaged, active and/or passive, etc. Examples of such electronic elements include microcontrollers, Microelectromechanical system (MEMs) devices, passive electronics such as resistors, capacitors and/or inductors, Op-amps, radio elements, pressure sensors, light emitting diodes (LEDs), strain sensors, memory devices, power management and/or battery components, actuators, etc. Examples of packaged component may include System on Chip (SoC) packages as well as multiple packaged components ganged into functional circuits mounted on flexible and/or stretchable interconnects systems and/or rigid interconnect systems such as FR4 or Kapton printed circuit boards (PCBs).

In some embodiments, transfer laminates and/or other modular components may be bonded and/or interconnected to a substrate and/or each other using any of the materials and/or techniques disclosed in U.S. Pat. No. 10,672,530, "DEFORMABLE CONDUCTORS AND RELATED SENSORS, ANTENNAS AND MULTIPLEXED SYSTEMS", issued on Jun. 2, 2020, and U.S. Pat. No. 11,088,063, "STRUCTURES WITH DEFORMABLE CONDUCTORS", issued on Aug. 10, 2021, both of which are incorporated by reference in their entirety.

In some embodiments, components hosted on transfer laminates may make electrical contact with a substrate and/or one another through I/O pads or pins which may make both mechanical and/or electrical connection during one or more assembly steps such as, for example, a bonding step. Such bonding may occur, for example, through chemical bonding, heat bonding, pressure bonding, ultrasonic bonding and/or any other method that may be used to bond similar or dissimilar materials such as polymer substrates to each other and/or to another substrate such as a textile, including through use of an intermediary agent such as an adhesive.

Some of the inventive principles of this disclosure may allow assembly of arbitrarily complex systems including, for example, general purpose CPU or microcontroller units around which peripheral sensors, user interfaces, and/or other accessory circuits may be placed at time of manufacture of a soft good such as apparel, footwear, industrial monitoring equipment, medical devices, and/or the like. The modular nature of some embodiments may allow a manufacturer to determine which functionality may be implemented on a product-by-product basis while adding functionality through a uniform bonding step, as one or more modular components may consists of a transfer laminate in, for example, a "hub and spoke" model in which the transfer laminate hosting the microcontroller may accept a wide variety of peripherals. Some embodiments may include an option of using multiple microcontroller transfer laminates to expand the general computation abilities and/or to increase the number of peripherals that may be added.

FIG. 1 is an example of a flexible and stretchable structure 102, in an example embodiment. The flexible and stretchable structure 102 includes a substrate layer 104 and a metal layer 106 on a major surface of the substrate layer 104. In various examples, the metal layer 106 is deposited onto the substrate layer 104. The metal layer 106 may be, e.g., oxygen-free copper secured to the substrate layer 104 according to any suitable mechanism. In various examples, the metal layer 106 is or includes a metal foil, which may be laminated to the substrate layer 104 in using a rolling operation in optionally in combination with at least one of heat and pressure. In various examples, the substrate layer 104 is formed from one of: a thermoset or thermoplastic film, such as a B-stage resin film, a C-stage resin film, an adhesive, a thermoset epoxy-based film or other stretchable film, thermoplastic polyurethane (TPU), and/or silicone, among other suitable compounds or materials. In one example, the flexible and stretchable structure 102 comprises a copper-clad epoxy-based film. Moreover, while the substrate layer 104 may be formed directly from any of the materials noted above, such materials may be obtained from any suitable source. Thus, for instance, transfer laminate formed in part from B-stage resin or TPU may be utilized as the substrate layer 104, with other portions of the transfer laminate included in the ultimate flexible and stretchable structure 102. The substrate layer 104 may therefore be defined as a flexible layer, and may thus may alternative be described as a flexible substrate layer 104. It should further be understood that a flexible substrate layer may also be stretchable, and therefore a flexible substrate layer may be defined as a flexible and stretchable substrate layer. Thus, the substrate layer 104 may be interchangeably described as any of a substrate layer, a flexible substrate layer, and a flexible and stretchable substrate layer.

While two layers are illustrated, i.e., the substrate layer 104 and the metal layer 106, it is to be recognized and understood that in this and in the various examples herein incorporating the flexible and stretchable structure 102 or structures formed according to the principles of the flexible and stretchable structure 102 that the number of layers may be increased as desired, e.g., according to an alternating pattern of substrate layers 104 and metal layers 106. Thus, examples herein with the flexible and stretchable structure 102 may incorporate multiple substrate layers 104 and/or metal layers 106, each configured in different ways as desired.

The flexible and stretchable structure 102 may utilize the metal layer 106 to electrically couple to or with external components of a wider system, such as a power source, external processor, control circuitry, and various discrete electrical components and the like. Details of a substrate layer 104 are disclosed in U.S. Patent Application Publication No. 2020/0381349, "CONTINUOUS INTERCONNECTS BETWEEN HETEROGENEOUS MATERIALS", Ronay et al., which is incorporated by reference herein in its entirety. Additionally or alternatively, the metal layer 106 may be substituted with an encapsulated fluid phase conductor layer, e.g., comprising a patterned metal gel or other fluid phase conductor disposed between at least one substrate layer 104 and an encapsulation layer (not shown).

Additionally or alternatively, the substrate layer 104 may have the following properties: tensile elongation of 550%; tensile modulus of 5.0 megapascals; recovery rate of 95%; thickness of 100 micrometers; a peel strength at 90 degrees of at least 1.0 kilonewtons per meter; a dielectric constant of 2.3 at 10 gigahertz; a dielectric dissipation factor of 0.0030 at 10 gigahertz; a breakdown voltage of 7.0 kilovolts at a thickness of 80 micrometers; a heat resistance that produces no change in an environment of 260 degrees Celsius for 10 cycles in a nitrogen atmosphere; and chemical resistance producing no change to the substrate layer 104 after 24 hours immersion in any of NaOH, Na2CO3, or copper etchant. In an example, the flexible and stretchable structure 102 may be or may include a second metal layer, e.g. a foil or other cladding, on a second major surface of the substrate layer 104 opposite the major surface on which the metal layer 106 is positioned, as illustrated. In various examples, the flexible and stretchable structure 102 may be or may include the structure disclosed in Patent Cooperation Treaty Application No. PCT/JP2017/045989, STRETCHABLE MEMBER WITH METAL FOIL, Tangyii et al., ("the '989 application") which is incorporated by reference herein in its entirety.

Figure 2:
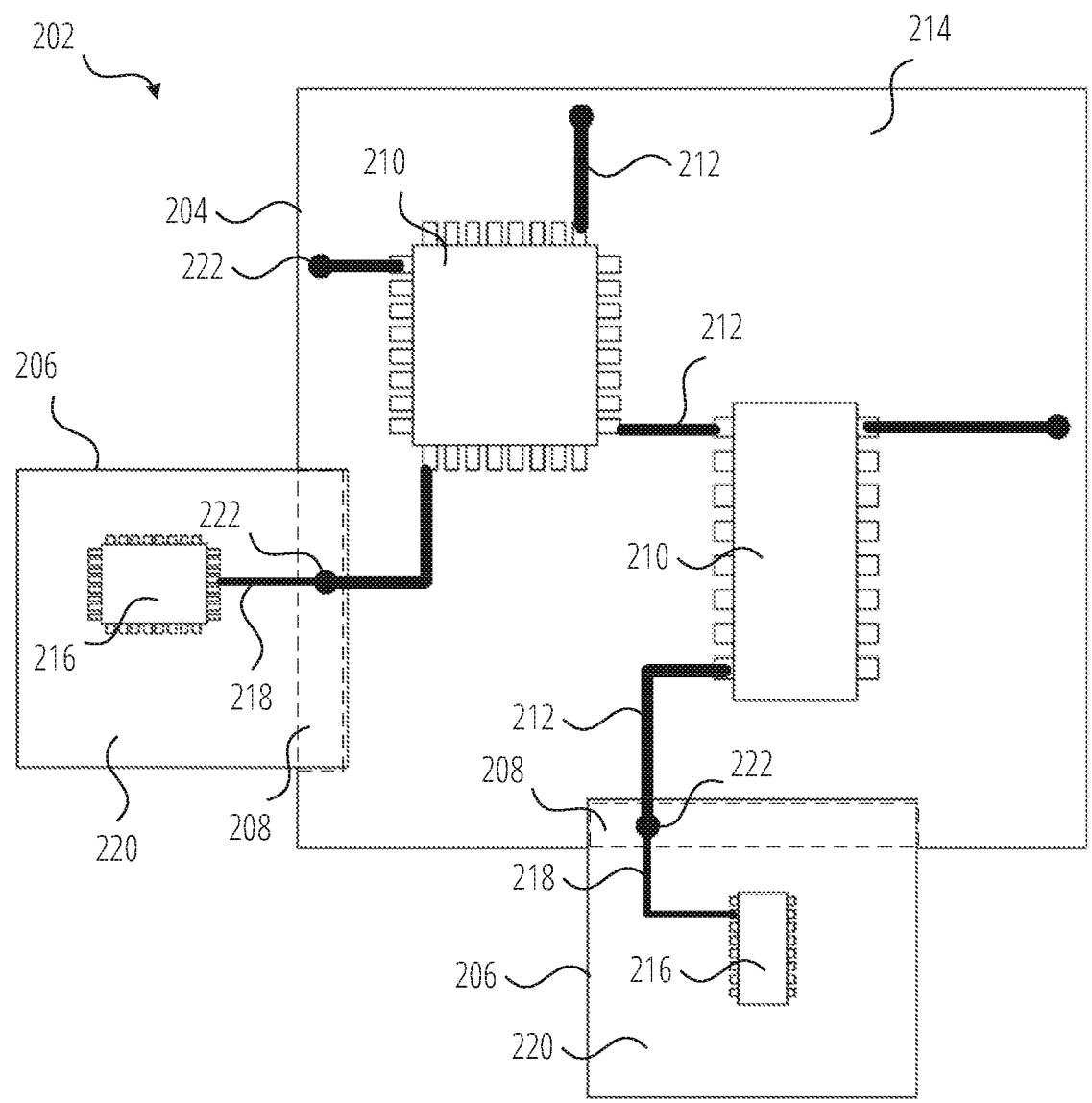
FIG. 2 is a simplified depiction of a modular flexible hybrid electronic system, in an example embodiment.

FIG. 2 is a simplified depiction of a modular flexible hybrid electronic system 202, in an example embodiment. While the modular flexible hybrid electronic system 202 illustrates various components of the system 202, for the purposes of clarity not all components are necessarily included. Moreover, while various techniques for forming the system 202 are described, is to be recognized and understood that such techniques are disclosed for the purposes of illustration of non-limiting ways the system 202 can be formed and that any suitable mechanisms may be implemented that aligns with the general principle of creating an electronic system that is flexible, modular; and scalable.

The modular flexible hybrid electronic system 202 includes a first structure 204 and second structures 206 coupled to the first structure 204. In an example, the second structures 206 are bonded to the first structure 204 in an interconnect region 208. However, in various examples any suitable mechanism for coupling the second structures 206 to the first structure 204 may be utilized as appropriate and desired based on the specific materials utilized and the desired connection between the first structure 204 and the second structures 206. Moreover, while the interconnect region 208 is depicted as a vertical overlapping portion of the first structure 204 and the second structure 206 within the interconnect region 208, it is to be recognized and understood that the interconnect region 208 may be a horizontal connection, with the first structure 204 and the second structure 206 coplanar with respect to one another and either coupled directly to one another or with a structure that enables coupling between the first structure 204 and the second structure 206, e.g., transfer laminate as disclosed herein. Moreover, the interconnect region 208 may vary across the system 202, with each interconnect region 208 not necessarily being implemented in the same way.

The first structure 204 includes first electronic components 210 and first flexible conductive traces 212 positioned on or within and secured to a first flexible substrate 214. The first flexible substrate 214 and the first flexible conductive traces 212 may be formed in part based on the flexible and stretchable structure 102 of FIG. 1 and with the same materials, as well as with conductive gel as disclosed herein. In an example, the first electronic components 210 include at least one controller, such as a microcontroller, processor, microprocessor, or any other electronic component that may receive information from other electronic components of the first structure 204 and of the modular flexible hybrid electronic system 202 generally, conduct computations or operations, and output data and/or commands to other electronic components of the first structure 204 and of the modular flexible hybrid electronic system 202 generally. The first electronic components 210 may also include any other suitable passive or active electronic components known in the art that may support the controller or that may provide data to or receive commands from the controller, including but not limited to a sensor, an input/output devices, a power source, and the like.

In the illustrated example, the first electronic components 210 are electrically coupled with respect to one another and to the interconnect regions 208 of the with first flexible conductive traces 212 positioned on or within the first flexible substrate 214. The first flexible conductive traces 212 are configured to flex or stretch in each dimension with the first flexible substrate 214 without breaking or otherwise losing electrical connectivity along the length of each first flexible conductive trace 212. In various examples, at least one of the first flexible conductive traces 212 includes a conductive gel as disclosed herein. In various examples, some or all of the first flexible conductive traces 212 include printed metal on a surface of the first flexible substrate 214. In such examples, the printed metal may be electrically coupled to the conductive gel to form a given first flexible conductive trace 212 or may, in various examples, form a complete first flexible conductive trace 212 among the various first flexible conductive traces 212.

The second structures 206 include similar elements in similar relation to one another as those of the first structure 204, with a second electronic component 216 and a second conductive trace 218 secured on or within and coupled to a second flexible substrate 220. The second flexible substrate 220 may be formed in the same manner and include the same materials as the first flexible substrate 214, i.e., may be homogenous with the first flexible substrate 214 and incorporate the properties and orientation of the flexible and stretchable structure 102. The second conductive trace 218 may be formed in whole or in part of conductive gel, and may further include printed metal on the second flexible substrate 220.

The second electronic component 216 may be an electronic component configured to work in conjunction with the first electronic component 210, where the first electronic component 210 is a controller. Thus, in various examples, the second electronic component 216 may be one or more of a sensor, an antenna, an input/output device, such as a light source, display, button, or the like, a power source, a high power electrical bus, a thermal power generator, an auxiliary controller, or the like. The sensor may be one or more of a strain sensor, an inductive pressure sensor, a resistive pressure sensor, or a capacitive touch sensor. The examples of the second electronic component 216 are provided by way of illustration and not limitation, and it is to be recognized and understood that any of a variety of active or passive electronic components may be or may make up the second electronic component 216. Thus, the second electronic component 216 may send information to or receive information from the first electronic component 210, e.g., in the form of a signal, a voltage, a current, etc., and otherwise work in conjunction with the first electronic component 210 as part of a common system. In various examples, one or more of the second structures 206 may be formed according to principles disclosed in U.S. Patent Publication No. 2019/0056277, "SENSORS WITH DEFORMABLE CONDUCTORS AND SELECTIVE DEFORMATION", filed on Oct. 11, 2018, and/or U.S. Patent Publication No. 2020/0386630, "DEFORMABLE SENSORS WITH SELECTIVE RESTRAINT", filed on Jun. 4, 2020, both of which are incorporated by reference herein in their entirety.

While the first flexible substrate 214 of the first structure 204 and the second flexible substrate 220 of the second structure 206 are described with respect to the flexible and stretchable structure 102 and the single substrate layer 104 thereof, it is to be recognized and understood that the first structure 204 and or the various second structures 206 may be formed according to any suitable multilayered process and that the single layer structures provided herein are for the purposes of illustration and not limitation, Thus, the first structure 204 and/or a second structure 206 may be multi-layered structures formed according to stencil-in-place methods disclosed, e.g., in U.S. Pat. No. 11,088,063, "STRUCTURES WITH DEFORMABLE CONDUCTORS", issued on Aug. 10, 2021, and in U.S. Provisional Patent Application No. 63/203,796, "FLEXIBLE AND STRETCHABLE STRUCTURES", filed Jul. 30, 2021, to which the instant application claims the benefit of priority, both of which are included herein in their entirety. Moreover, any other suitable multi-layered flexible structure or method of making such a multi-layered flexible structure may be utilized to produce multilayered first structures first structure 204 and/or second structures 206.

In the illustrated example, each interconnect region 208 includes at least one via 222 that is configured to couple a first flexible conductive trace 212 of the first structure 204 to an associated second conductive trace 218 of a second structure 206. In various examples, the vias 222 are formed with conductive gel according to stencil-in-place mechanisms. The vias 222 exist both as coupling the first structure 204 to an associated second structure 206 and as a potential connection point for another second structure 206 to the added to the modular flexible hybrid electronic system 202 at a later time. Thus, in various examples, where a via 222 is part of an interconnect region 208, the via 222 extends from the first flexible substrate 214 to the second flexible substrate 220 and through a transfer laminate or other intervening material or structure, as will be illustrated herein. In examples where a via 222 is not currently part of an interconnect region 208, i.e., where the via 222 does not extend to a second structure 206 that is currently part of the modular flexible hybrid electronic system 202 and consequently serves in part as a connection point, the via 222 may extend through at least a portion of the first flexible substrate 214.

The first structure 204 and/or the second structures 206 may be formed according to island structures as disclosed herein. In such island architecture, contact pads associated with the electronic components 210 and/or 216 may be coupled to vias 222 to extend across multiple layers of a first structure 204 or second structure 206. Thus, while the vias 222 are illustrated as being included within the interconnect regions 208 for the purposes of electrically coupling a second structure 206 to the first structure 204, one or more vias 222 may be utilized to electrically couple to or between conductive traces 212 and/or 218 of the stencil-in-place portion an associated first structure 204 or second structure 206 in one or more layers, Such vias 222 may extend to the contact pads of the island structure and may be filled with metal gel alone and/or in combination with another fluid phase conductor, a conductive epoxy, solder or other conductive medium physically and/or electrically coupled to the contact pads As illustrated the first structure 204 is a hub structure and the second structures 206 are peripheral structures. In an example, the hub or first structure 204 may be defined as any structure which is configured to be coupled to multiple other structures while the peripheral or second structures 206 may be defined as any structure which is configured to be coupled to only one other structure, i.e., a hub or first structure 204.

The hub structure may also be understood to be a structure that includes as the first electronic component 210 a controller, though it is to be recognized and understood that peripheral structures may also include a controller that may operate to supplement the controller of the first structure 204. Consequently, the presence of a controller is not necessarily dispositive to the identification of a first structure 204 or a second structure 206.

The modular flexible hybrid electronic system 202 is configured to be flexible by being capable of stretching, folding, or otherwise changing orientation or dimension to some significant extent along any of the three spatial dimensions without breaking or losing electrical contact between and among the various components and elements of the modular flexible hybrid electronic system 202. Consequently, while the total ability to stretch, flex, bend, or otherwise deform may be limited by the physical properties of the materials used, e.g., for the flexible substrates 214, 220, or the capacity of the electronic components 210, 216 to maintain electrical contact with the traces 212, 218, the modular flexible hybrid electronic system 202 may nonetheless be far more flexible or otherwise deformable than conventional modular electronics or even prior modular electronics specifically designed to be flexible. The first structure 204 and second structures 206 may further incorporate a stiffener or a stretch lockout feature, e.g., proximate the first electronic components 210 and second electronic components 216. In some embodiments, the reinforcing member is a textile segment, a polymer film segment, e.g., a polyimide film, or any other suitable flexible material. In various examples, the reinforcing member may cause the modular flexible hybrid electronic system 202 to have a bend radius larger than twice the length of the first electronic components 210 and second electronic components 216, as appropriate. The bend radius may be calculated using the principles of IPC-2223's design standards.

As noted above, the depiction of the modular flexible hybrid electronic system 202 is simplified for the purposes of illustrating the components thereof and that as such more or, in certain instances fewer, electronic components 210, 216, traces 212, 218, and vias 222 may be implemented. In particular, the interconnect regions 208 may typically be expected to have multiple vias 222 to allow for control input or output, sensor signal output, power, ground, and other purposes known in the art. In various examples, each interconnect region 208 includes a common set of vias 222 that allows each interconnect region 208 to be an interchangeable and standard node at which any of a variety of standard peripheral second structures 206 may be attached. Thus, in such an example, a user may specially configure a given modular flexible hybrid electronic system 202 as desired to serve a particular function by the modular addition of specific second structures 206 to interconnect regions 208. Owing to the common structure of the interconnect regions 208 and the physical configuration of the second structures 206, the overall modular flexible hybrid electronic system 202 is thus modularly extensible and configurable while maintaining the flexibility and stretchability of each first structure 204 and second structure 206.

Figure 3:
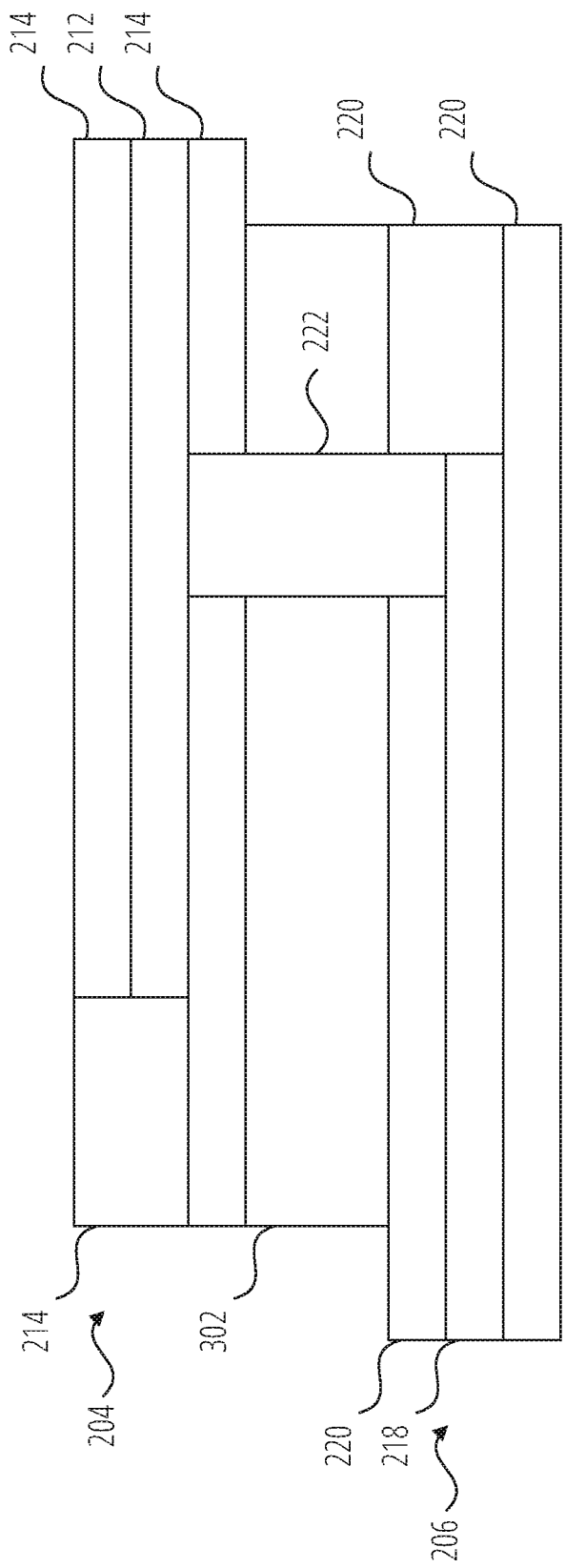
FIG. 3 is a detailed block diagram cutaway view of an interconnect region, in an example embodiment.

FIG. 3 is a detailed block diagram cutaway view of an interconnect region 208, in an example embodiment. The interconnect region 208 incorporates a transfer laminate layer 302 to bond the first flexible substrate 214 of the first structure 204 to the second flexible substrate 220 of the second structure 206. A via 222 extends through the first flexible substrate 214, the transfer laminate layer 302 and the second flexible substrate 220 to electrically couple the first flexible conductive trace 212 to the second conductive trace 218.

As noted above, the transfer laminate layer 302 may be any suitable transfer laminate that can bond the first flexible substrate 214 to the second flexible substrate 220, e.g., through the application of heat and/or pressure to the transfer laminate layer 302, the first flexible substrate 214, and the second flexible substrate 220. In an example, the via 222 is formed by drilling or otherwise forming a hole in the transfer laminate layer 302 and inserting conductive gel into the hole as formed, causing the transfer laminate layer 302 to function as an encapsulant for the conductive gel. In various examples, the hole is also drilled or otherwise formed in the first flexible substrate 214 and second flexible substrate 220, e.g., through the stencil-in-place process disclosed herein.

The use of transfer laminate in the modular flexible hybrid electronic system 202 is not limited to the transfer laminate layer 302. As noted above, the first flexible substrate 214 and/or the second flexible substrate 220 themselves may be formed in part from transfer laminate and/or materials common to transfer laminate. As such, the interconnect region 208 in particular may be a homogenous interconnection between the first structure 204 and the second structure 206.

Moreover, transfer laminate may be utilized more generally in the modular flexible hybrid electronic system 202 to allow the modular flexible hybrid electronic system 202 to be bonded to other structures. Thus, for instance, the modular flexible hybrid electronic system 202 may be bonded to textiles, fabrics, rubbers, stretchable polymers, or any other suitable substrate. In such examples, sensors that have been included in the modular flexible hybrid electronic system 202 may sense conditions of the substrate, input/output devices of the modular flexible hybrid electronic system 202 may provide functionality for the substrate, e.g., where the substrate is part of a wearable article, and so forth.

In an example, a smart shirt may include a microcontroller on a first structure 204 connected to any manner of peripherals on second structures 206. For example, a first structure 204 may include a microcontroller hosted on a transfer laminate and may be connected to a second structure 206 including a series of at least one light emitting diode (LED) which is itself on a transfer laminate, in an example, the microcontroller may drive an LED pattern or other visual output. Some embodiments may additionally include a second structure 206 including one or more strain sensing peripheral laminates which may be attached and/or bonded to the same first structure 204 including the microcontroller laminate such that strain experienced at the physical location of the strain sensing peripheral second structure 206 may inform the microcontroller of how to drive the LED pattern. In some embodiments, a separate a peripheral second structure 206 hosting a pressure sensor or button may be bonded in place to allow user selection of the LED display and/or any other function. As such, with the modular system disclosed herein, a manufacturer may be able to quickly and/or efficiently assemble a wide variety of products, for example, at a variety of price points and/or serving a variety of functions all using the same or similar process of modular structures bonded together in the same or similar processes. It is to be recognized and understood that the principles disclosed herein may further be applied to including shoes, leggings, hats, backpacks or other bags, industrial textiles, upholstery, geotextiles, non-textile membranes and/or any other article of manufacture in which a transfer laminate may be bonded.

Figure 4:
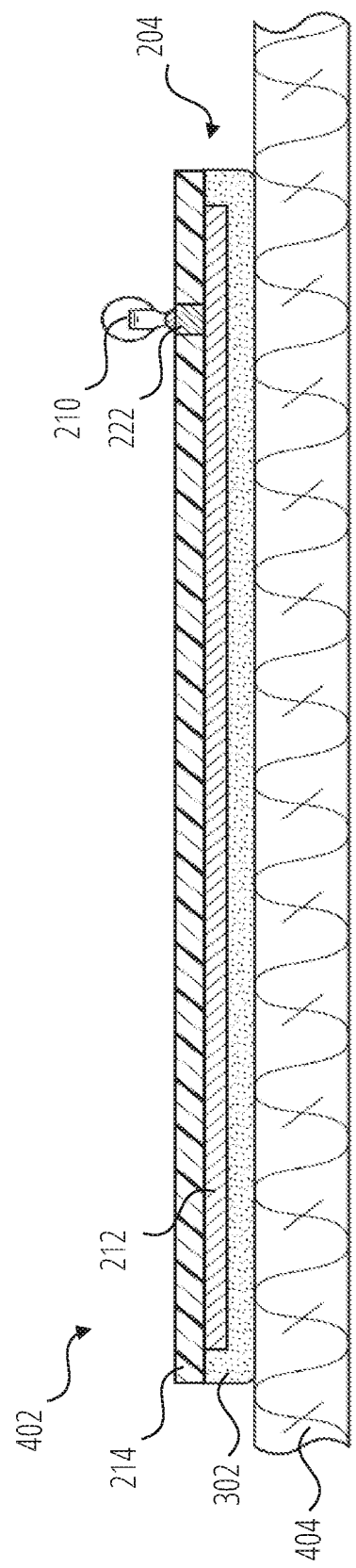
FIG. 4 is a cutaway depiction of a textile system, in an example embodiment.

FIG. 4 is a cutaway depiction of a portion of a textile system 402, in an example embodiment. The textile system 402 includes the first structure 204, with the second structures 206 of the modular flexible hybrid electronic system 202 not depicted for the sake of simplicity of the figure. However, it is to be recognized and understood that at least one second structure 206 is operatively coupled to the first structure 204 as disclosed herein, and that the second structure 206 may be implemented according to the same principles disclosed with respect to the first structure 204.

The first structure 204 includes a transfer laminate layer 302 bonded to the first flexible substrate 214 and to a textile 404. The transfer laminate layer 302 thus functions both as an encapsulant for the first flexible conductive trace 212 as well as a bonding agent with a textile 404, thereby securing the first structure 204 specifically and the modular flexible hybrid electronic system 202 generally to the textile 404. A via 222 containing conductive gel is formed in the first flexible substrate 214 to electrically couple the first electronic component 210 to the first flexible conductive trace 212.

Consequently, the various components of the modular flexible hybrid electronic system 202 may flex, stretch, or otherwise move in conjunction with the textile 404. As a result, a sensor incorporated on the first structure 204 or on a second structure 206 may sense changes in the textile 404 or in conditions around the textile 404, e.g., of a wearer of the textile 404 or user of the textile system 402 generally, or of an ambient condition of or around the textile 404. In various examples, the textile 404 is comprised of non-conductive or insulative fibers, filaments, or threads, e.g., nylon or other suitable non-conductive material. In various additional or alternative examples, the textile 404 may incorporate conductive threads or fibers in addition to or instead of the non-conductive fibers.

As in the above systems, the textile system 402 is presented for example and not for limitation, and it is to be recognized and understood that various combinations and permutations of components disclosed herein may be implemented. Thus, in various examples, the textile system 402 may couple the textile 404 to the first flexible substrate 214 instead of or in addition to the transfer laminate layer 302 or to any other suitable component of the textile system 402.

Figure 5:
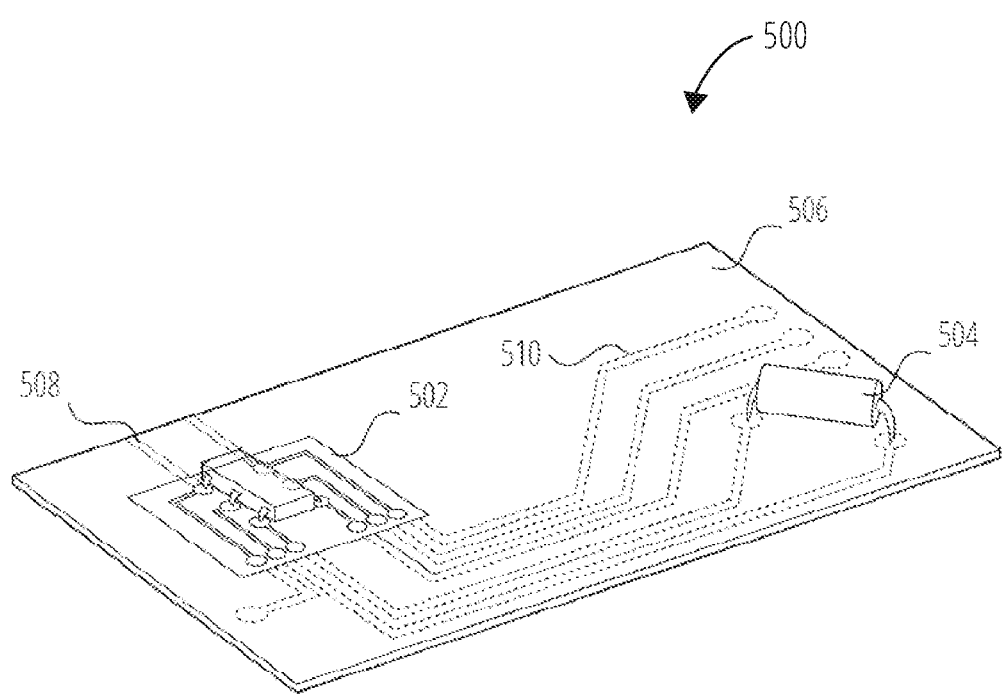
FIG. 5 is a top isometric view of an example flexible circuit incorporating island architecture, in an example embodiment.

FIG. 5 is a top isometric view of an example flexible circuit incorporating island architecture, in an example embodiment. Flexible circuit 500 includes a board 506 that may include one or more stencil-in-place structures. An island structure 502 may be similar to one of the stretchable metal clad film structures disclosed above and may be coupled to flexible circuit 500. An additional electronic component 504 may be included in flexible circuit 500, physically attached to a stencil-in-place portion of the board 506 and configured to electrically couple to metal gel traces 508 and 510, and/or island structure 502 as shown, or in various configurations in accordance with circuit design conventions. In some embodiments, the thicknesses of metal gel traces 508 and 510 may differ from metal traces provided on the island structure 502. As described herein, island structure 502 includes at least a stretch substrate 104, a metal layer 102 provided with a pattern of metal traces and contact pads, and an electronic component 302 and may be a separate circuit configured to be placed onto or within a larger circuit (e.g., flexible circuit 500). The island structure 502 may be electrically coupled to traces of the stencil-in-place portion of flexible circuit 500 by one or more vias in one or more layers of both the island structure 502 and flexible circuit 500. Such vias may extend to the contact pads of the island structure 502 and may be filled with metal gel alone and/or in combination with another fluid phase conductor, a conductive epoxy, solder or other conductive medium physically and/or electrically coupled to the contact pads.

In all examples, a structure may be constructed additively in a layer by layer process, where each layer is formed and placed on top (or below) previously assembled layers. Thus, each layer may be customized in many different ways so as to provide desired characteristics of the overall structure. Each layer may be formed from substantially one material, with the exception of a stencil layer, which as described above, has slots or channels filled with conductive gel. However, it should be noted that for low power circuits using a metal film layer 106, the volume of metal required to perform the functions contemplated for the structures disclosed herein is relatively minimal. Thus, the resulting thicknesses of a metal layer may be very small, e.g., 200 microns or less, or approximately 0.010" inches or less. Handling and assembling a layer this thin may be difficult in a manufacturing environment. Thus, e.g., the metal layer(s) 106 and, e.g., substrate layer(s) 104 may be provided as one film or layer when assembling, e.g., the structures 102. Furthermore, the single layer may be processed prior to assembly to a structure, for example, to remove un-needed metal material, for example by chemical etching as described above. Alternatively, the metal layer may be deposited additively to a laminate structure as a discrete layer. It may be advantageous to additively provide the metal layer when the structure requires the metal layer to have a relatively large surface area to perform the contemplated function, e.g.: to provide RF shielding to a circuit; act as a high power bus; to serve as a ground plane; or other functions or configurations that may require a relatively large pattern or sheet of metal layer, or that may be easily provided as a discrete layer during a manufacturing operation. As previously contemplated, a metal layer 106 may be substituted with an encapsulated fluid phase conductor layer, e.g., comprising a patterned metal gel or other fluid phase conductor disposed between at least one substrate layer 104 and an encapsulation layer (not shown).

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled, Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled, A further hardware module may then, at a later time, access the memory device to retrieve and process the stored output, Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations, Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

The electrically conductive compositions, such as conductive gels, comprised in the articles described herein can, for example, have a paste like or gel consistency that can be created by taking advantage of, among other things, the structure that gallium oxide can impart on the compositions when gallium oxide is mixed into a eutectic gallium alloy. When mixed into a eutectic gallium alloy, gallium oxide can form micro or nano-structures that are further described herein, which structures are capable of altering the bulk material properties of the eutectic gallium alloy.

As used herein, the term "eutectic" generally refers to a mixture of two or more phases of a composition that has the lowest melting point, and where the phases simultaneously crystallize from molten solution at this temperature. The ratio of phases to obtain a eutectic is identified by the eutectic point on a phase diagram. One of the features of eutectic alloys is their sharp melting point.

The electrically conductive compositions can be characterized as conducting shear thinning gel compositions. The electrically conductive compositions described herein can also be characterized as compositions having the properties of a Bingham plastic. For example, the electrically conductive compositions can be viscoplastics, such that they are rigid and capable of forming and maintaining three-dimensional features characterized by height and width at low stresses but flow as viscous fluids at high stress, Thus, for example, the electrically conductive compositions can have a viscosity ranging from about 10,000,000 cP to about 40,000,000 cP under low shear and about 150 to 180 at high shear. For example under condition of low shear the composition has a viscosity of about 10,000,000 cP, about 15,000,000 cP, about 20,000,000 cP, about 25,000,000 cP, about 30,000,000 cP, about 45,000,000 cP, or about 40,000,000 cP under conditions of low shear, Under condition of high shear the composition has a viscosity of about 150 cP, about 155 cP, about 160 cP, 165 cP, about 170 cP, about 175 cP, or about 180 cP.

The electrically conductive compositions described herein can have any suitable conductivity, such as a conductivity of from about 2×10⁵ S/m to about 8×10⁵ S/m.

The electrically conductive compositions described herein can have any suitable melting point, such as a melting point of from about −20° C. to about 10° C., about −10° C. to about 5° C., about −5° C. to about 5° C. or about −5° C. to about 0° C.

The electrically conductive compositions can comprise a mixture of a eutectic gallium alloy and gallium oxide, wherein the mixture of eutectic gallium alloy and gallium oxide has a weight percentage (wt of between about 59.9% and about 99.9% eutectic gallium alloy, such as between about 67% and about 90%, and a wt % of between about 0.1% and about 2.0?/gallium oxide such as between about 0.2 and about 1%. For example, the electrically conductive compositions can have about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, about 95%, about 96%, about 97%, about 98%, about 99%, or greater, such as about 99.9% eutectic gallium alloy, and about 0.1%, about 0.2%, about 0.3%, about 0.4%, about 0.5%, about 0.6%, about 0.7%, about 0.8%, about 0.9%, about 1.0%, about 1.1%, about 1.2%, about 1.3%, about 1.4%, about 1.5%, about 1.6%, about 1.7%, about 1.8%, about 1.9%, and about 2.0% gallium oxide.

The eutectic gallium alloy can include gallium-indium or gallium-indium-tin in any ratio of elements. For example, a eutectic gallium alloy includes gallium and indium. The electrically conductive compositions can have any suitable percentage of gallium by weight in the gallium-indium alloy that is between about 40% and about 95%, such as about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

The electrically conductive compositions can have a percentage of indium by weight in the gallium-indium alloy that is between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

The eutectic gallium alloy can include gallium and tin. For example, the electrically conductive compositions can have a percentage of tin by weight in the alloy that is between about 0.001% and about 50%, such as about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, or about 50%.

The electrically conductive compositions can comprise one or more micro-particles or sub-micron scale particles blended with the eutectic gallium alloy and gallium oxide. The particles can be suspended, either coated in eutectic gallium alloy or gallium and encapsulated in gallium oxide or not coated in the previous manner, within eutectic gallium alloy. The micro- or sub-micron scale particles can range in size from nanometer to micrometer and can be suspended in gallium, gallium-indium alloy, or gallium-indium-tin alloy. Particle to alloy, ratio can vary and can change the flow properties of the electrically conductive compositions. The micro and nano-structures can be blended within the electrically conductive compositions through sonication or other suitable means. The electrically conductive compositions can include a colloidal suspension of micro and nano-structures within the eutectic gallium alloy/gallium oxide mixture.

The electrically conductive compositions can further include one or more micro-particles or sub-micron scale particles dispersed within the compositions. This can be achieved in any suitable way, including by suspending particles, either coated in eutectic gallium alloy or gallium and encapsulated in gallium oxide or not coated in the previous manner, within the electrically conductive compositions or, specifically, within the eutectic gallium alloy fluid. These particles can range in size from nanometer to micrometer and can be suspended in gallium, gallium-indium alloy, or gallium-indium-tin alloy. Particle to alloy ratio can vary, in order to, among other things, change fluid properties of at least one of the alloy and the electrically conductive compositions. In addition, the addition of any ancillary material to colloidal suspension or eutectic gallium alloy in order to, among other things, enhance or modify its physical, electrical or thermal properties. The distribution of micro and nano-structures within the at least one of the eutectic gallium alloy and the electrically conductive compositions can be achieved through any suitable means, including sonication or other mechanical means without the addition of particles. In certain embodiments, the one or more micro-particles or sub-micron particles are blended with the at least one of the eutectic gallium alloy and the electrically conductive compositions with wt % of between about 0.001% and about 40.0% of micro-particles, for example about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, or about 40.

The one or more micro- or sub-micron particles can be made of any suitable material including soda glass, silica, borosilicate glass, quartz, oxidized copper, silver coated copper, non-oxidized copper, tungsten, super saturated tin granules, glass, graphite, silver coated copper, such as silver coated copper spheres, and silver coated copper flakes, copper flakes, or copper spheres, or a combination thereof, or any other material that can be wetted by the at least one of the eutectic gallium alloy and the electrically conductive compositions. The one or more micro-particles or sub-micron scale particles can have any suitable shape, including the shape of spheroids, rods, tubes, a flakes, plates, cubes, prismatic, pyramidal, cages, and dendrimers. The one or more micro-particles or sub-micron scale particles can have any suitable size, including a size range of about 0.5 microns to about 60 microns, as about 0.5 microns, about 0.6 microns, about 0.7 microns, about 0.8 microns, about 0.9 microns, about 1 microns, about 1.5 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, about 26 microns, about 27 microns, about 28 microns, about 29 microns, about 30 microns, about 31 microns, about 32 microns, about 33 microns, about 34 microns, about 35 microns, about 36 microns, about 37 microns, about 38 microns, about 39 microns, about 40 microns, about 41 microns, about 42 microns, about 43 microns, about 44 microns, about 45 microns, about 46 microns, about 47 microns, about 48 microns, about 49 microns, about 50 microns, about 51 microns, about 52 microns, about 53 microns, about 54 microns, about 55 microns, about 56 microns, about 57 microns, about 58 microns, about 59 microns, or about 60 microns.

The electrically conductive compositions described herein can be made by any suitable method, including a method comprising blending surface oxides formed on a surface of a eutectic gallium alloy into the bulk of the eutectic gallium alloy by shear mixing of the surface oxide/alloy interface. Shear mixing of such compositions can induce a cross linked microstructure in the surface oxides; thereby forming a conducting shear thinning gel composition. A colloidal suspension of micro-structures can be formed within the eutectic gallium alloy/gallium oxide mixture; for example as, gallium oxide particles and/or sheets.

The surface oxides can be blended in any suitable ratio, such as at a ratio of between about 59.9% (by weight) and about 99.9% eutectic gallium alloy, to about 0.1% (by weight) and about 2.0% gallium oxide. For example percentage by weight of gallium alloy blended with gallium oxide is about 60%, 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, about 95%, about 96%, about 97%, about 98%, about 99%, or greater, such as about 99.9% eutectic gallium alloy while the weight percentage of gallium oxide is about 0.1%, about 0.2%, about 0.3%, about 0.4%; about 0.5%, about 0.6%, about 0.7%, about 0.8%, about 0.9%, about 1.0%, about 1.1%, about 1.2%, about 1.3%, about 1.4%, about 1.5%, about 1.6%; about 1.7%; about 1.8%, about 1.9%, and about 2.0% gallium oxide. In embodiments, the eutectic gallium alloy can include gallium-indium or gallium-indium-tin in any ratio of the recited elements. For example, a eutectic gallium alloy can include gallium and indium.

The weight percentage of gallium in the gallium-indium alloy can be between about 40% and about 95%, such as about 40%, about 41%; about 42%, about 43%; about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

Alternatively or in addition, the weight percentage of indium in the gallium-indium alloy can be between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

A eutectic gallium alloy can include gallium, indium, and tin. The weight percentage of tin in the gallium-indium-tin alloy can be between about 0.001% and about 50%, such as about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, OF about 50%.

The weight percentage of gallium in the gallium-indium-tin alloy can be between about 40% and about 95%, such as about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

Alternatively or in addition, the weight percentage of indium in the gallium-indium-tin alloy can be between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

One or more micro-particles or sub-micron scale particles can be blended with the eutectic gallium alloy and gallium oxide. For example, the one or more micro-particles or sub-micron particles can be blended with the mixture with wt % of between about 0.001% and about 40.0% of micro-particles in the composition, for example about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, or about 40. In embodiments the particles can be soda glass, silica; borosilicate glass, quartz, oxidized copper, silver coated copper, non-oxidized copper, tungsten, super saturated tin granules, glass, graphite, silver coated copper, such as silver coated copper spheres, and silver coated copper flakes, copper flakes or copper spheres or a combination thereof, or any other material that can be wetted by gallium. In some embodiments the one or more micro-particles or sub-micron scale particles are in the shape of spheroids, rods, tubes, a flakes, plates, cubes, prismatic, pyramidal, cages, and dendrimers. In certain embodiments, the one or more micro-particles or sub-micron scale particles are in the size range of about 0.5 microns to about 60 microns, as about 0.5 microns, about 0.6 microns, about 0.7 microns, about 0.8 microns, about 0.9 microns, about 1 microns, about 1.5 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, about 26 microns, about 27 microns, about 28 microns, about 29 microns, about 30 microns, about 31 microns, about 32 microns, about 33 microns, about 34 microns, about 35 microns, about 36 microns, about 37 microns, about 38 microns, about 39 microns, about 40 microns, about 41 microns, about 42 microns, about 43 microns, about 44 microns, about 45 microns, about 46 microns, about 47 microns, about 48 microns, about 49 microns, about 50 microns, about 51 microns, about 52 microns, about 53 microns, about 54 microns, about 55 microns, about 56 microns, about 57 microns, about 58 microns, about 59 microns, or about 60 microns.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

What is claimed is:

1. A flexible hybrid electronic system, comprising:
    a first structure, comprising:
        a first flexible substrate;
        a first electronic component secured to the first flexible substrate; and
        a first flexible conductive trace formed in part from a eutectic gallium alloy and enclosed within the first flexible substrate;
    a second structure, comprising:
        a second flexible substrate;
        a second electronic component secured to the second flexible substrate; and
        a second flexible conductive trace formed in part from the eutectic gallium alloy and enclosed within the second flexible substrate; and
    a via, filled with a conductive medium and extending between and electrically coupling the first flexible conductive trace to the second flexible conductive trace, wherein the first structure is bonded to the second structure at an interconnect region and the via is located within the interconnect region.

2. The apparatus of claim 1, wherein the first structure is a hub structure and the second structure is a peripheral structure.

3. The apparatus of claim 2, wherein the hub structure comprises a plurality of interconnect regions, each configured to be bonded to a different peripheral structure, wherein the hub structure comprises a plurality of flexible conductive traces, wherein each of the plurality of interconnect regions includes at least one of the plurality of conductive traces.

4. The apparatus of claim 2, wherein the first electronic component comprises a controller and the second electronic component provides information to the controller.

5. The apparatus of claim 4, wherein the second electronic component is one of: a sensor, an antenna, a light source, a display, a power source, an auxiliary controller, a high power electrical bus, or a thermal power generator.

6. The apparatus of claim 5, wherein the sensor is at least one of: a strain sensor, an inductive pressure sensor, a resistive pressure sensor, and a capacitive touch sensor.

7. The apparatus of claim 1, wherein the first and second flexible substrates are comprised of a common material.

8. The apparatus of claim 1, wherein the first and second flexible substrates are bonded together with a transfer laminate.

9. The apparatus of claim 8, wherein the transfer laminate comprises at least one of a resin layer and a thermoplastic film layer.

10. The apparatus of claim 9, wherein the resin layer is comprised of a B-stage resin.

11. The apparatus of claim 10, wherein the first and second flexible conductive traces are formed at least in part within a channel formed within the B-stage resin.

12. The apparatus of claim 8, wherein the transfer laminate comprises at least a portion of at least one of the first and second flexible substrates.

13. The apparatus of claim 12, wherein the transfer laminate comprises an additional layer, the additional layer being one of a thermoplastic film and a B-stage resin film.

14. The apparatus of claim 13, wherein the via extends through the transfer laminate.

15. The apparatus of claim 12, wherein the first and second structures are bonded using at least one of heat and pressure.

16. The apparatus of claim 1, wherein at least one of the first and second flexible conductive traces form a via within the interconnect region that electrically couples the first and second flexible conductive traces with respect to one another.

17. The apparatus of claim 1, wherein the first structure comprises a metal layer coupled to the first flexible substrate.

18. The apparatus of claim 17, wherein the metal layer is electrically coupled to the first flexible conductive trace.

19. The apparatus of claim 17 wherein the first electronic component is attached to the metal layer such that the first electronic component is secured to the first flexible substrate by the metal layer.

* * * * *